United States Patent [19]

Oguey et al.

[11] 4,041,522
[45] Aug. 9, 1977

[54] INTEGRATED CIRCUIT AND MANUFACTURE THEREOF

[75] Inventors: Henri J. Oguey, Corcelles, NE; Bernard Gerber, Neuchatel, both of Switzerland

[73] Assignee: Centre Electronique Horloger S.A., Switzerland

[21] Appl. No.: 605,845

[22] Filed: Aug. 19, 1975

[30] Foreign Application Priority Data

Aug. 29, 1974  Switzerland ............... 11788/74

[51] Int. Cl.$^2$ ............... H01L 27/02; H01L 29/78; H01L 29/04
[52] U.S. Cl. ............................ 357/42; 357/23; 357/41; 357/51; 357/59
[58] Field of Search .............. 357/23, 41, 42, 51, 357/59

[56] References Cited

PUBLICATIONS

IBM Tech. Bul., vol. 14, No. 11, Apr. 1972, p. 3255, Doo et al., "Dynamic SCR Memory with Poly-Si-Diode".
Electronics, Aug. 30, 1971, pp. 38-43, Burgess et al., "C/MOS Unites with Silicon Gate...".

Primary Examiner—Edward J. Wojciechowicz
Attorney, Agent, or Firm—Stevens, Davis, Miller & Mosher

[57] ABSTRACT

An integrated circuit comprises complementary FET having channels extending on the surface of a substrate and on the surface of a well in the substrate and gates formed in a layer of polycrystalline silicon insulated from the substrate and from each said well. A floating diode, i.e. connected neither to the substrate, nor to a well, is formed simultaneously with the FET by depositing and selectively etching a first doped oxide to cover a first region of the polycrystalline silicon, depositing an oppositely doped oxide over the remainder using the first oxide as mask, and oppositely doping the two regions of polycrystalline silicon by heat treatment. Alternatively, the second region can be doped by treatment in a gaseous phase or by ionic implantation, in either case using the first oxide as mask. Said regions are contiguous under the edge of the first doped oxide to form an autoaligned junction forming said floating diode which has a reverse conductivity notably greater than that of a junction in monocrystalline silicon, and easily reproduceable characteristics.

1 Claim, 12 Drawing Figures

INTEGRATED CIRCUIT AND MANUFACTURE THEREOF

The invention concerns an integrated circuit comprising complementary field-effect transistors (FET) with a polycrystalline silicon gate and at least one floating diode, and a process of manufacturing such a circuit.

There are well known techniques (F. Faggin & Klein, "Silicon Gate Technology", Solid State Electronics, Vol. 13, p. 1125–1141, 1970, and Swiss Pat. No. 542,518) for the simultaneous production of complementary FET, also called C/MOS, i.e. n-channel FET and p-channel FET. Logic circuits with complementary FET have many advantages, in particular a low static consumption, a dynamic consumption proportional to the frequency of transitions, a relatively high speed and a great noise immunity. In a complex integrated circuit, it is sometimes necessary to incorporate an analog function, i.e. in which a voltage or current level, an amplitude of oscillation or an amplification factor must take a well defined value. For this purpose it is desirable to be able to incorporate elements such as capacitors and resistors in the circuit. An object of the invention is precisely to produce high-value resistive elements with reproduceable characteristics and manufacture of which is compatible with a well tried C-MOS technology.

Various manners of incorporating resistive elements in an integrated circuit have already been tried, and all involve several drawbacks. For example, in a known circuit for a quartz timepiece (R. R. Burgers & R. G. Daniels "C/MOS Unites with Silicon Gate to Yield Micropower Technology", Electronics, 30th August 1971, p. 28–43), the oscillator comprises an inverter amplifier with complementary FET, a 20pF capacitance and a 50 mΩ resistance. The capaitance does not require an additional manufacturing step; on the contrary, the resistance is in slighly doped polycrystalline silicon, and the doping requires supplementary operations. The resistances obtained by the mentioned process have numerous disadvantages. Firstly, they involve extra manufacturing operations. Also, they are liable to great variations if the resistivity is great (J. George & J. Chruma "The Application of Ion Implantation in CMOS", Solid State Technology, Nov. 1973, p. 43–46). By choosing a lower resistivity it would also be possible to obtain a resistance of high value, but at the cost of a large surface area. Moreover, at high frequencies, the residual capacitance associated with such a large surface area would be troublesome in producing a much lower impedance than desired.

A proposal has been made to replace the polarisation resistance of an oscillator by two field-effect transistors connected as dipoles in parallel, in U.S. Pat. No. 3,753,154. This arrangement is not very satisfactory because these additional transistors are not truly speaking floating dipoles, but their sources and drains behave as diodes connected to the substrate, which produces a unilateral limitation of the gate voltage of the operative transistor. Furthermore, this circuit involves such a high residual capacitance that it cannot be used at high frequencies.

Finally, various known circuits include p–n junctions in polycrystalline silicon. The techniques used always involve one drawback or another. For example, in a protective circuit disclosed in French Pat. No. 2,145,460, the diodes are produced by the diffusion mask technique with the drawback of involving poor reproduceability because of the tolerances for aligning masks in a sequential diffusion process, in addition to the fact that two masks have to be brought into cooperation solely for the purpose of defining the junction.

Another example is given in U.S. Pat. No. 3,749,987 which involves the same disadvantages in its structure. Also, the type of doping used leads to the formation of a Schottky barrier diode. Finally, in French Pat. No. 2,156,543, which is concerned with equalisation of steps of a monolithic circuit, the structure obtained does not show that the introduction of supplementary components to the transistors has been simplified. The previous doping and masking techniques are still unable to produce an abrupt self-aligned floating junction without additional manufacturing operations compared to well tried C-MOS technology.

The invention proposes a circuit which achieves the stated object and obviates the stated disadvantages. According to the invention, an integrated circuit comprising complementary field effect transistors (FET) whose channels extend on the surface of the substrate for one type of transistor and on the surface of a well in the substrate for the complementary type and whose gates are formed in a layer of polycrystalline silicon insulated from the substrate and from said wells, is characterized in that a first region of said layer of polycrystalline silicon is covered with a doped insulator, the remainder of the layer of polycrystalline silicon forming a second oppositely-doped region, and in that at at least one location under the edge of the doped insulator, the two regions are contiguous creating a self-aligned junction forming a socalled floating diode connected neither to the substrate nor to said wells, and which has, used in the circuit, a reverse conductivity notably greater than that of a junction in monocrystalline silicon, said diode having well-reproduceable characteristics.

The invention also comprises a process for manufacturing the circuit, characterized in that said floating diode is produced during the same operations as the field effect transistors.

The basic idea thus consists of using the necessary steps in the technology of circuits with complementary FET known from the cited Swiss Pat. No. 542,518, to provide supplementary components in the layer of polycrystalline silicon provided for the FET gates. It was proven that the components produced have certain interesting features.

With the adopted solution, abrupt junctions are produced between two non-compensated strongly doped regions, forming a resistive element of high impedance that can be used instead of a non-linear resistance or component, with a number of advantages.

Firstly, manufacturing is compatible with a well-proven technology, without any supplementary manufacturing operations or use of a supplementary mask. The element obtained is a floating diode and its leakage current is relatively high.

Certain interesting properties of p–n junctions in a polycrystalline silicon layer are known (J. Manolin & T. I. Kamins, "P-N Junctions in Polycrystalline-silicon Films", Solid State Electronics, Vol. 15, p. 1103–1106, 1972). The element obtained by this junction may be used either as a diode if it is polarized in the forward direction, or as a non-linear resistance of high value if it is either not polarized or polarized in the reverse direction, while offering certain advantages:

It may be connected in series or in parallel without restriction in the d.c. voltage in relation to the substrate (connection in series enables a symmetric element to be obtained, or to reduce non-linear effects). This element combines very small dimensions (hence saving of space) with a high current density and has a very low junction capacitance and a very low residual capacitance in relation to the substrate. It is thus suitable for rapid circuits in high frequency applications. The characteristics of this element, in particular the value of its resistance, are better reproduceable than those of resistances in polycrystalline silicon, and the similitude of the properties of two neighbouring elements is excellent. Moreover, the element is electrically insulated, which facilitates interconnections.

The accompanying drawings show, by way of example, several embodiments of circuits according to the invention. In the drawings.

Figure 1:
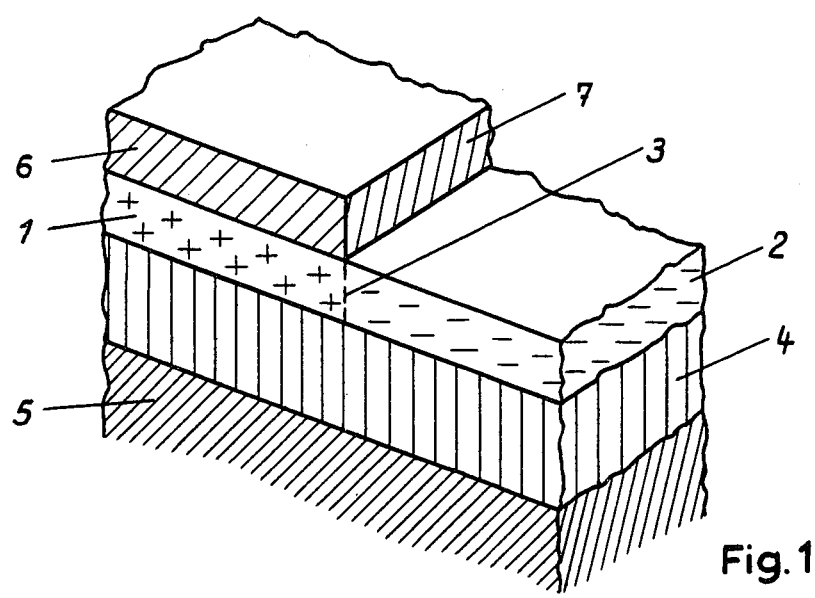
FIG. 1 is a schematic perspective view of a characteristic element of a circuit according to the invention.
Figure 3:
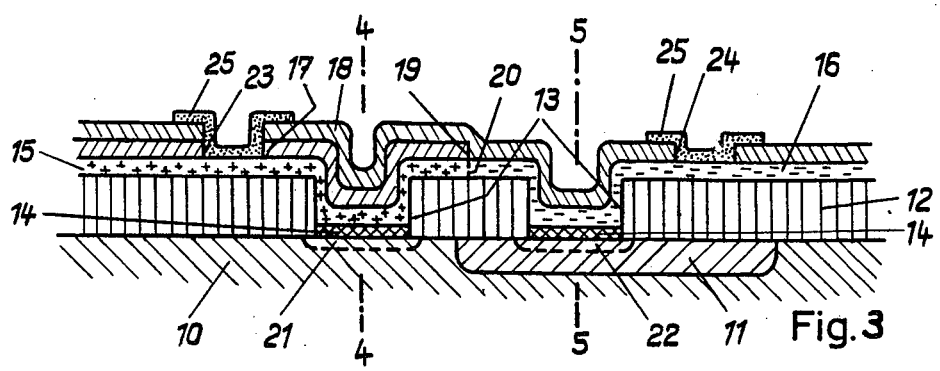
FIG. 3 is a cross-section along line 3—3 of FIG. 2.
Figure 2:
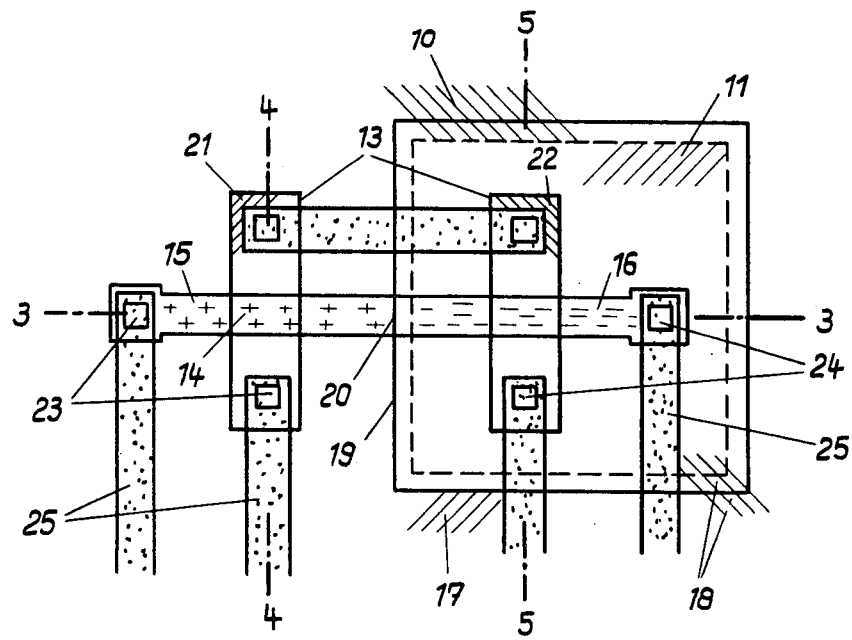
FIG. 2 is a plan view of an integrated circuit obtained by means of doped oxides, to illustrate one example of the manufacturing process.
Figure 4:
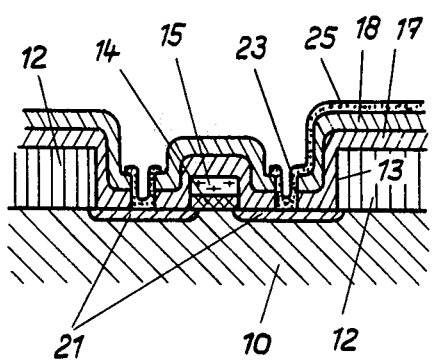
FIG. 4 is a cross-section along line 4—4 of FIG. 2.
Figure 5:
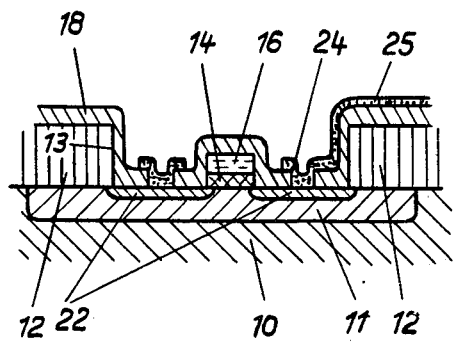
FIG. 5 is a cross-section along line 5—5 of FIG. 2.

FIG. 1 is a schematic view of a characteristic element of a circuit. It consists of a polycrystalline silicon layer having a first p-doped region 1 and a second n-doped region 2, forming at their interface 3 a p–n junction. This layer of polycrystalline silicon is deposited on an amorphous insulating layer 4 such as silicon dioxide, below which is a base 5 of monocrystalline silicon forming a starting slice. An insulator 6 is deposited above one of the regions of polycrystalline silicon. It has a dual purpose. Firstly, it serves as source of a doping agent: if it contains boron atoms it produces a p-type doping, and if it contains phosphorous atoms it produces an n-type doping. Secondly, it serves as a mask for the other type of doping agent. By a conventional photoetching process, the doped insulator 6 is removed from zones where an opposite type of doping is required. The edge 7 unequivocally defines the location of the p–n junction. Details of the element can differ according to the manufacturing process used. A first process consists of using successively deposited p and n doped oxides (Swiss Pat. No. 542,518) to obtain the strongly doped regions of the sources and drains of complementary MOS transistors as well as to dope the polycrystalline silicon serving as gate of these transistors, and used in the element under consideration. This process is used to manufacture the structure shown in FIGS. 2 to 5. FIG. 2 is a plan view of a structure comprising a p-channel transistor (left hand part) and an n-channel transistor (right hand part) with a p–n junction in the layer of polycrystalline silicon (center). FIG. 3 is a cross-section of FIG. 2 showing the central p–n junction and the gates of the left and right hand transistors. FIG. 4 is a cross-section showing the source and drain of the p-channel transistor, and FIG. 5 a cross-section showing the source and drain of the n-channel transistor. The structure shown comprises a substrate 10 of $n^-$ doped well 11. Substrate 10 with well 11 is covered with a thermally grown oxide layer 12 about 1 $\mu$m thick; openings 13 are provided in layer 12 at the locations where the transistors and the strongly doped regions must be placed. A thin oxide layer 14 0.1 $\mu$m thick is thermally grown on the silicon surface in these openings to form the gate oxide of the transistors. A layer 15, 16 of polycrystalline silicon 0.6 $\mu$m thick is deposited in the gaseous phase then selectively etched in a manner to produce the desired geometry. After a slight etching of the oxide in a manner to remove the thin oxide layer non-covered with polycrystalline silicon 15,16 from regions 13 (FIGS. 4 and 5), a boron-doped oxide 17 is deposited at low temperature and then selectively etched to delimit the region to be p-doped, then a phosphorous-doped oxide 18 is deposited. These operations are followed by a heat treatment of about 45 min. at 1100° C during which the boron and phosphorous atoms diffuse in all of the regions of mono- and polycrystalline silicon in contact with the correspondingly-doped oxides. In particular, an edge 19 of the boron-doped oxide, covered with a phosphorous-doped oxide produces in the underlying polycrystalline silicon layer 15,16 a p–n junction 20 between the p-doped region 15 and n-doped region 16 of polycrystalline silicon. At the same time, the regions of the sources and drains 21 of the p-channel transistors are obtained by diffusion of boron in the regions of substrate 10 in contact with the boron-doped oxide 17, whereas the regions of sources and drains 22 of the n-channel transistors are obtained by diffusion of phosphorous in regions 22 of the well 11 in contact with the phosphorous-doped oxide 18. These regions are shown in dotted lines in FIG. 3 because they are not in the plane of the cross-section passing through the middle of the gates; they are however shown in FIGS. 4 and 5 which are cross-sections perpendicular to that of FIG. 3. The following manufacturing operations consist of a selective etching of the oxides to form contact windows 23,24 on the polycrystalline silicon 15,16 (FIG. 3) as well as on the monocrystalline silicon 10 (FIGS. 4 and 5) doped by means of the doped oxides. After deposit of a layer 25 of aluminium, a final selective etching defines the metallic interconnections.

The use of diodes of polycrystalline silicon instead of resistances of slighly doped polycrystalline silicon enables reduction of the number of photolithographic masks requires in the process of diffusion with doped oxides from seven to six.

When an ohmic contact is required between two regions of polycrystalline silicon of opposed types, use is made of the known method of providing a metallic (aluminium) connection making an ohmic contact with each of the regions. By including this method in the process of manufacturing the junctions, it is for example possible to obtain several diodes connected in series and each having a current flow in the same direction.

Figure 6:
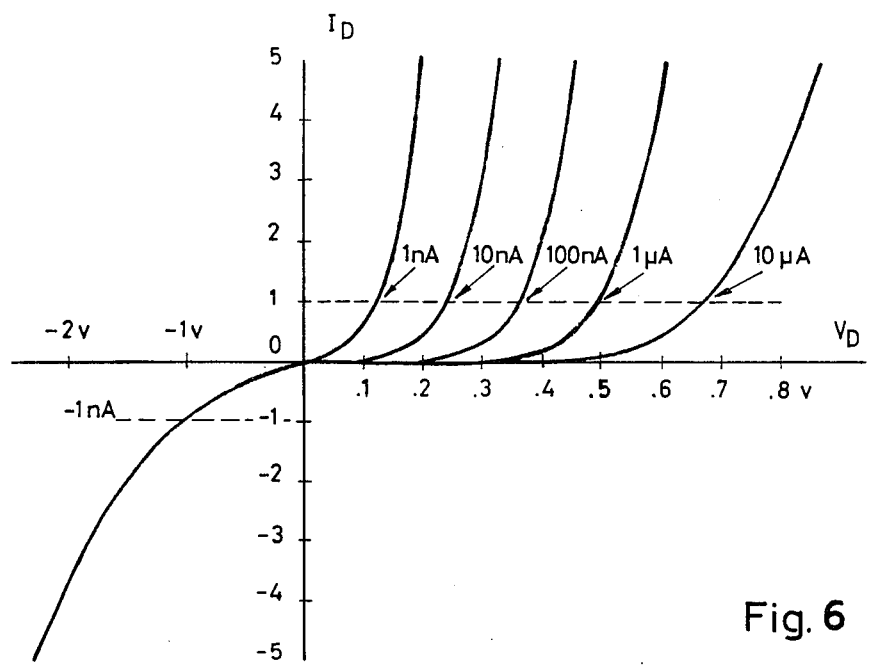
FIG. 6 shows the current-voltage characteristics of a junction whose structure corresponds to FIGS. 2 and 3.

FIG. 6 shows the current-voltage characteristics measured at ambient temperature of a junction obtained in a layer of polycrystalline silicon according to the just-described process. The width of the junction is 8 $\mu$m. In the forward direction, these characteristics have, for low currents, an exponential increase of the current with voltage, and a less rapid increase when the current exceeds 10 µA. In the inverse direction, the current increases more than linearly with voltage, but nevertheless remains very low. For a voltage of the order of 1 Volt, the equivalent resistance is of the order of 1 GΩ (i.e. $10^9\Omega$). These characteristics may vary by a factor of 2 to 3 between two diodes manufactured separately. To the contrary, two neighbouring diodes on the same slice and having the same geometry have similar characteristics to within a few percent.

In relation to p–n junctions in monocrystalline silicon, the p–n junctions obtained in layers of polycrystalline silicon have two very advantageous properties: the current densities at a given voltae are 100 to 1000 times greater, and the lifetime of the minority carriers is reduced in the same proportion.

The first property enables production of junctions of very small section, thus occupying very little place and having a very low residual capacitance.

The second property, taken together with the first, is advantageous at high frequencies and makes the use of diodes of polycrystalline silicon possible in ultra-rapid circuits where the use of diodes of monocrystalline silicon would be impossible.

A variant of the previously-described process, also shown in FIG. 3, consists of conserving the first doped oxide to define and mask a region of polycrystalline silicon with a first type of doping. Complementary doping of the other region is then carried out by a preliminary deposit in the gaseous phase at a temperature comprised between 900 and 1200° C. A non-doped insulator 18 is then deposited on all the surface. An optional high temperature treatment may serve to simultaneously complete diffusion of the two zones. The following operations (providing contact-window openings and metalisation) are the same as for the first process.

A second variant of the manufacturing process is the same as the previous variant, except that the preliminary deposite in gaseous phase is replaced by ionic implantation.

Figure 7:
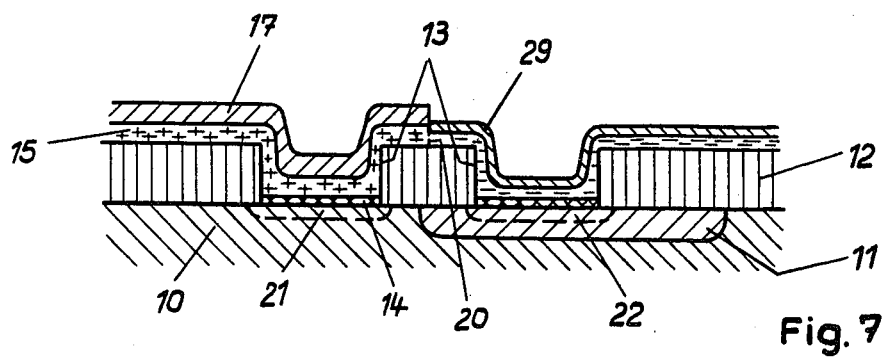
FIG. 7 illustrates another circuit produced by another manufacturing process.

A third variant, shown in FIG. 7, of the manufacturing process consists of replacing the deposit of a non-doped insulator by a high temperature treatment in an oxiding atmosphere to provide a protective oxide 29 layer on the surface of the polycrystalline silicon 15. The other reference numerals correspond to the similar parts of FIG. 3.

FIGS. 8 to 12 show circuits incorporating diodes formed by p–n junctions in a layer of polycrystalline silicon. These diodes are represented by the conventional symbol for monocrystalline diodes. It should however be remarked that these circuits are designed taking into account specific properties of the described junctions, are substitution by a monocrystalline diode is not envisaged.

The diodes of polycrystalline silicon have the advantage of being very small structures disposed on a thick oxide. The residual capacitance associated therewith is very small (10fF, for example). The sectional area of their junction is very small and also involves a very low capacitance (2fF, for example). They are thus particularly suitable for high frequency and high impedance applications, in particular in circuits which must have a very low current consumption.

Figure 8:
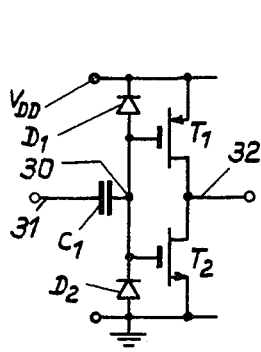
FIG. 8 is a diagram of a first amplifier circuit including floating diodes.

FIG. 8 shows a stage of an amplifier circuit with capacitive coupling, comprising two diodes of polycrystalline silicon $D_1$ and $D_2$, a p-channel FET $T_1$, an n-channel FET $T_2$, and a coupling capacitor $C_1$. The transistors are connected in series between a positive supply terminal $V_{DD}$ and ground. The gates of the two FET are connected together at a point 30 and are connected respectively via diode $D_1$ to terminal $V_{DD}$ and via diode $D_2$ to ground. The cathode of $D_1$ is connected to $V_{DD}$ and the anode of $D_2$ to ground, so that the two diodes are polarised in the same direction. The coupling capacitor $C_1$ is connected between an input terminal 31 and the gates (i.e. point 30). The diodes are made as equal as possible by simulatneously manufacturing them in the same integrated circuit, by placing them close together and by giving them identical geometries. These diodes will have current-voltage characteristics very close to one another, and as the d.c. current flowing through them is the same (zero current in the gates of the transistors and in the capacitor), the voltage at point 30 will be substantially half the voltage $V_{DD}$.

The FET are hence chosen in such a manner that their threshold voltages $V_T$ and their $\beta$-factors, as conventionally defined (W. N. Carr & J. P. Mize, "MOS/LSI Design and Applications", McGraw Hill Book Co., New York 1972, p. 52), are equal. They are thus polarized in the best possible conditions for an amplifier, i.e. the output voltage at point 32 is also equal to a half of $V_{DD}$ and the amplification factor reaches its maximum. The lower cut-off frequency $f_{min}$ of the amplifier is defined by $$f_{min} = 1/(2.\pi \, R_{eq} \, C_1)$$

where $R_{eq}$ is the equivalent resistance represented by the diodes. As this resistance is very high, a small capacitance is sufficient to reach a relatively low cut-off frequency. For example, $R_{eq} = 100$ MΩ, $C_1 = 32$ pF, $f_{min} = 50$Hz. This circuit is 100% monolithic.

Figure 9:
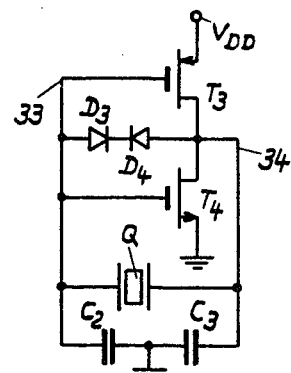
FIG. 9 is a diagram of an oscillator circuit including floating diodes.

The diagram of FIG. 9 shows an oscillator circuit for a quartz crystal, derived from a known circuit (RCA, COS/MOS Integrated Circuits Manual, Technical Series CMS-270, 1971, p. 147, FIG. 146). A p-channel FET $T_3$ and an n-channel FET $T_4$ are connected in series between a positive supply terminal $V_{DD}$ and ground. They form an amplifier whose input 33 and output 34 are each connected to one of the terminals of a quartz crystal Q as well as to ground via capacitors $C_2$ and $C_3$. This circuit finally comprises, between points 33 and 34, a polarisation element formed by two diodes $D_3$ and $D_4$ in polycrystalline silicon connected in series and in opposition. This circuit is polarized so that the d.c. voltage at input 33 is equal to the d.c. voltage at output 34, even if the transistors are not identical. This condition subsists even in the presence of an oscillation, as long as the common point of $D_3$ and $D_4$ is not capacitively charged or the capacitances of $C_2$ and $C_3$ are substantially equal.

Figure 10:
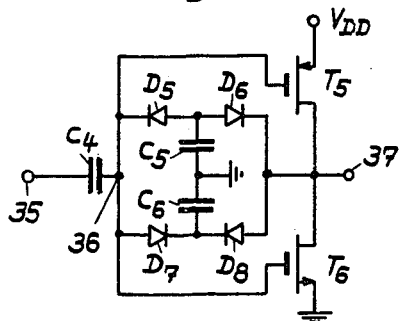
FIG. 10 is a diagram of a second amplifier circuit including floating diodes.

The circuit of FIG. 10 is an amplifier well suited to convert a high frequency sinusoidal voltage into a square wave able to serve as an input signal of logic circuits. It is formed of two complementary FET $T_5$ and $T_6$. This amplifier is fed by the high frequency voltage at point 35 through a coupling capacitor $C_4$. Four diodes $D_5$ to $D_8$ of the described type are connected between the input 36 and the output 37 of the amplifier in the following manner: a first pair $D_5$–$D_6$ is arranged with the cathode of $D_5$ connected to input terminal 36 and its anode connected to the anode of $D_6$, and the cathode of $D_6$ is connected to output terminal 37. A second pair $D_7$–$D_8$ is arranged with the anode of $D_7$ connected to input terminal 36 and its cathode connected to the cathode of $D_8$, and the anode of $D_8$ is connected to output terminal 37. This arrangement ensures that the amplifier has a d.c. polarization close to the maximum amplification point when the high frequency signal has a low amplitude. In normal operation, the amplitude of the high frequency signal is sufficient for the output signal to be a square wave whose peak-to-peak amplitude is very close to the supply voltage $V_{DD}$. This square wave produces at the anode of $D_6$ a d.c. voltage close to its negative peaks and at the cathode of $D_8$ a d.c. voltage close to its positive peaks. These two voltages are held constant by the residual capacitances $C_5$ and $C_6$ associated with the nodes of $D_5/D_6$ and $D_7/D_8$. The diodes $D_5$ and $D_7$, which are supposed to be similar, produce at the input of the inverter (amplifier) a d.c. voltage substantially equal to the mean of these two voltages, i.e. a half of the voltage of the supply battery, as in the circuit of FIG. 10.

Figure 11:
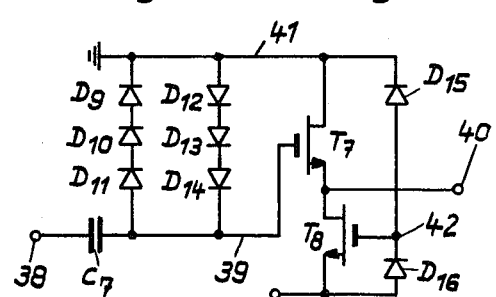
FIG. 11 is a diagram of a third amplifier circuit including floating diodes.

FIG. 11 shows a current amplifier comprising an active $n$-channel transistor $T_7$ whose drain is connected to ground 41 and whose source is connected to output terminal 40 as well as to the drain of a load transistor $T_8$. The gate of transistor $T_7$ is connected to input terminal 38 via a coupling capacitor $C_7$, and to ground via a network of six polycrystalline silicon diodes $D_9$ to $D_{14}$. The diodes $D_9$, $D_{10}$ and $D_{11}$ are connected in series between gate 39 and ground 41 with their cathodes facing the ground side. The diodes $D_{12}$, $D_{13}$ and $D_{14}$ are also connected in series between gate 39 and ground 41, but with their anodes facing the ground side. In the absence of an input voltage, the diodes act as high resistances in parallel, and maintain the gate 39 at zero potential. In the presence of a sinusoidal input voltage, diodes $D_9$ to $D_{11}$ conduct during positive voltage phases, and diodes $D_{12}$ to $D_{14}$ conduct in the opposite direction during negative voltage phases. If the six diodes are all equal to one another, the alternating voltage is centred in relation to the mean of its positive and negative phases. It is maintained at zero if the voltage is sinusoidal. The reason for placing several diodes in series is to allow a fairly large amplitude of the input voltage (0.7V) without the peak current in the diodes being high (maximum 30nA). The symmetry of these diodes is guaranteed with an excellent precision if they have the same geometry. Six identical junctions are thus obtained. The diodes can be connected to a point at non-zero potential if a different polarization of the amplifier is required. There cannot be this possibility if only diodes obtained by diffusion in monocrystalline silicon are used, since these diodes are not "floating" and cannot be interconnected at will. The advantages of a polarization circuit with diodes, in relation to one with resistors, are an appreciable saving of area, a fabrication compatible with complementary FET technology without additional steps, and an exponential current-voltage characteristic which also acts to limit the voltage, hence as an input protection against static discharges when handling the circuit.

The $n$-channel load transistor $T_8$ of the circuit of FIG. 11 supplies transistor $T_7$ with d.c. while having a high a.c. impedance. Its drain is connected to the source of $T_7$ and its source to the negative terminal $V_{SS}$ of a voltage source (not shown). The voltage of gate 42 of transistor $T_8$ acts, by means of its drain current, on the transconductance of $T_7$.

A voltage divider formed of two polycrystalline-silicon diodes $D_{15}$ and $D_{16}$ connected between ground 41 and the negative terminal $V_{SS}$, is connected to the gate 42 of transistor $T_8$ and serves to produce a voltage substantially equal to a half of $V_{SS}$.

Figure 12:
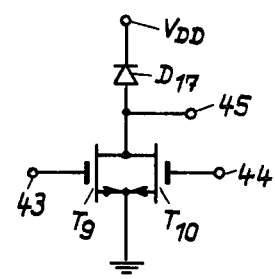
FIG. 12 is a diagram of a logic gate including a floating diode.

FIG. 12 shows an example in which a diode of polycrystalline silicon serves as load resistance in a logic circuit, namely a NOR gate with two input terminals 43 and 44 having two $n$-channel FET $T_9$ and $T_{10}$ whose drains are connected together and to the anode of a polycrystalline-silicon diode $D_{17}$ whose cathode is connected to a positive terminal $V_{DD}$. The sources of the two FET $T_9$, $T_{10}$ are connected to ground. This arrangement forms an elementary logic circuit which can be completed by connecting further FET in series or in parallel. By combining two such stages, an RS trigger circuit is obtained. Such circuits in which the load resistances are FET polarized at constant voltage are known (W. N. Carr and J. P. Mize "MOS/LSI Design and Application", McGraw Hill Book Co., New York 1972, FIGS. 4.11b and 4.19b). The use of diodes of polycrystalline silicon according to the invention leads to a more compact geometry and a much lower static consumption. The circuit obtained is relatively slow and is thus suitable for low frequency stages of a complex circuit whose rapid stages would be formed by complementary FET circuits.

Other known static circuits can be modified by replacing the usual load elements such as resistors or fixed-polarization FET by diodes of polycrystalline silicon, to form circuits according to the present invention.

What is claimed is:

1. In an integrated circuit comprising complementary field effect transistors (FET) having channels extending on the surface of a substrate for one type of transistor and on the surface of a well in the substrate for the complementary type and gates formed in a layer of polycrystalline silicon insulated from the substrate and from each said well, and at least one so-called floating diode connected neither to the substrate nor to a said well, the improvement comprising a doped insulator covering a first region of said layer of polycrystalline silicon, the remainder of said layer of polycrystalline silicon forming a second oppositely-doped region, said two regions being contiguous at at least one location under an edge of said doped insulator to form an autoaligned junction forming said diode, said diode having a reverse conductivity notably greater than that of a junction in monocrystalline silicon, and having well-reproduceable characteristics.

* * * * *